US005783969A

United States Patent [19]
Luz

[11] Patent Number: 5,783,969
[45] Date of Patent: Jul. 21, 1998

[54] METHOD AND SYSTEM FOR PREVENTING AN AMPLIFIER OVERLOAD CONDITION IN A HYBRID MATRIX AMPLIFIER ARRAY

[75] Inventor: Yuda Yehuda Luz, Euless, Tex.

[73] Assignee: Motorola, Inc., Schaumburg, Ill.

[21] Appl. No.: 708,864

[22] Filed: Sep. 4, 1996

[51] Int. Cl.$^6$ .................................................. H03F 3/68
[52] U.S. Cl. ............................. 330/124 R; 330/207 P
[58] Field of Search ........................... 330/53, 124 D, 330/124 R, 207 D, 286, 295, 298

[56] References Cited

U.S. PATENT DOCUMENTS

| | | | |
|---|---|---|---|
| 3,732,217 | 5/1973 | Gerset et al. | 330/56 |
| 5,604,462 | 2/1997 | Gans et al. | 330/124 R |
| 5,610,556 | 3/1997 | Rubin | 330/295 X |
| 5,638,024 | 6/1997 | Dent et al. | 330/124 R |

OTHER PUBLICATIONS

Sandrin, W.A., "The Butler Matrix Transponder", Comstat Technical Review, vol. 4, No. 2, Fall 1974, pp. 319–344.
Meredith, Sheldon, presentation on Cellwave Smart System at "Second Annual Workshop on Smart Antennas in Wireless Mobile Communications", Jul. 20–21, 1995, Stanford University.
Gerst, Carl. W., "Hybrid Matrix Amplifiers", An Anaren White Paper, Nov. 1995.

Primary Examiner—Steven Mottola
Attorney, Agent, or Firm—Bruce Terry

[57] ABSTRACT

In a hybrid matrix amplifier array (100), the amplitude of each of a plurality of input signals is measured (132–136, 202). In response to the signal amplitude measurements, an overload condition that will result in an amplifier overload in said hybrid matrix amplifier array is estimated (204, 206, 138). In response to the estimation of the overload condition, the signal amplitude of at least one of the plurality of input signals is modified to prevent the overload condition in the hybrid matrix amplifier array. An overload condition may be estimated if the sum of the amplitudes of the input signals exceeds a threshold (206). In one embodiment, all input signals are modified by proportionately reducing the amplitude of each of the plurality of input signals (304).

19 Claims, 7 Drawing Sheets

*PRIOR ART*

FIG. 1

*PRIOR ART*

FIG. 2

*PRIOR ART*

METHOD AND SYSTEM FOR PREVENTING AN AMPLIFIER OVERLOAD CONDITION IN A HYBRID MATRIX AMPLIFIER ARRAY

FIELD OF THE INVENTION

The present invention is related in general to signal amplification, and more particularly to an improved method and system for preventing an amplifier overload condition in a hybrid matrix amplifier array.

BACKGROUND OF THE INVENTION

Figure 1:
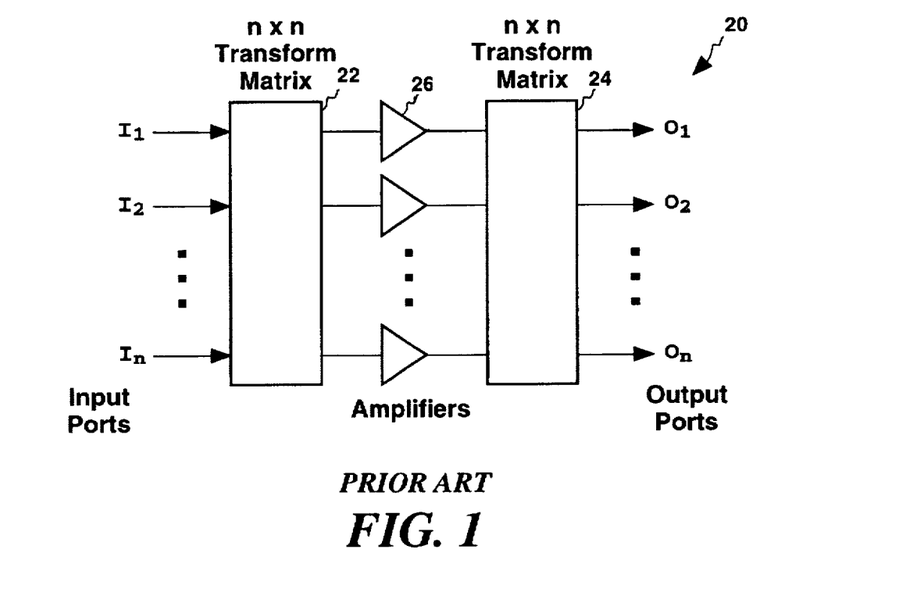
FIG. 1 is a high-level depiction of a prior art hybrid matrix amplifier.

A hybrid matrix amplifier is a parallel set of amplifiers, each having inputs fed, and outputs combined, with multiport matrices made up of hybrid couplers. The general configuration of a hybrid matrix amplifier 20 is shown in FIG. 1. Hybrid matrices 22 and 24 connected in the manner shown create information paths—extending from $I_n$ to $O_n$—which are separate at the input ports $I_n$ and output ports $O_n$. Between hybrid matrices 22 and 24 amplifier array 26 is used to amplify signals. These signals between the matrices are distributed evenly in amplitude, and have a specific phase relationship according to which input port $I_n$ the signal entered. When amplifier array 26 is configured between matrices 22 and 24, all amplifiers in amplifier array 26 share the amplification of the signal on the path $I_1$ to $O_1$, as well as signals on all other n−1 paths.

Figure 2:
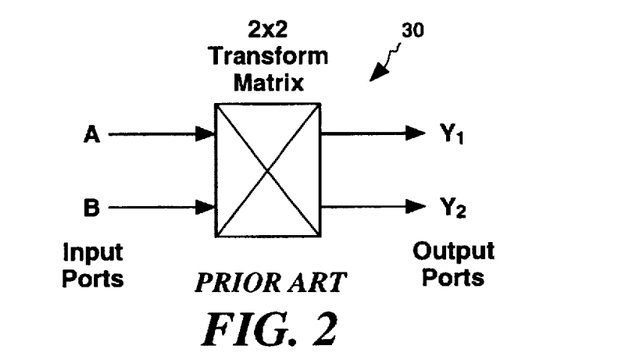
FIG. 2 is a schematic representation of a prior art coupler used in a transform matrix.

A basic building block of many transform matrices is a 90° hybrid- or 3 dB coupler, which is shown schematically in FIG. 2 as coupler 30. Coupler 30 has four ports: two input ports, A and B, and two output ports, $Y_1$ and $Y_2$. Coupler 30 is typically linear and reciprocal. Because of the reciprocal nature of coupler 30, input ports A and B can be interchanged with output ports $Y_1$ and $Y_2$. The coupler also has a given characteristic bandpass and characteristic impedances at the ports.

In operation, if signal A is received at input port A of coupler 30, the power or energy of the signal is split into two equal quantities, with one quantity fed to output port $Y_1$ and the other fed to output port $Y_2$. The signal phase of the power transmitted from output port $Y_2$ is delayed by 90 electrical degrees, or one-quarter of an operating wavelength, from the signal phase of the power transmitted from output port $Y_1$. Similarly, if the power of signal B is received at input port B, the power of the signal is split into two equal quantities, with half of the power fed to output port $Y_1$ and the other half fed to output port $Y_2$. And the signal phase of the power from signal B transmitted from output port $Y_1$ is delayed by 90 electrical degrees, or one-quarter of an operating wavelength, from the signal phase of the power transmitted from output port $Y_2$.

Thus, if signal A is applied to input port A, and signal B applied to input port B, signals appearing at output ports $Y_1$ and $Y_2$ are represented by the equations below.

$$Y_1 = \frac{A}{\sqrt{2}} \angle -90° + \frac{B}{\sqrt{2}} \angle -180°$$

$$Y_2 = \frac{A}{\sqrt{2}} \angle -180° + \frac{B}{\sqrt{2}} \angle -90°$$

$$\frac{1}{\sqrt{2}} \begin{bmatrix} -j & -1 \\ -1 & -j \end{bmatrix} \begin{bmatrix} A \\ B \end{bmatrix} = \begin{bmatrix} Y_1 \\ Y_2 \end{bmatrix} \text{ } j \text{ is } 1\angle 90° = \text{sqrt}(-1)$$

As shown by the above equations, if signal power is simultaneously applied to input ports A and B, signal superposition occurs because the coupler is linear.

In summary, any power received at an input port is divided equally between the output ports of the coupler, and signals transmitted by the output ports have a phase difference.

Figure 3:
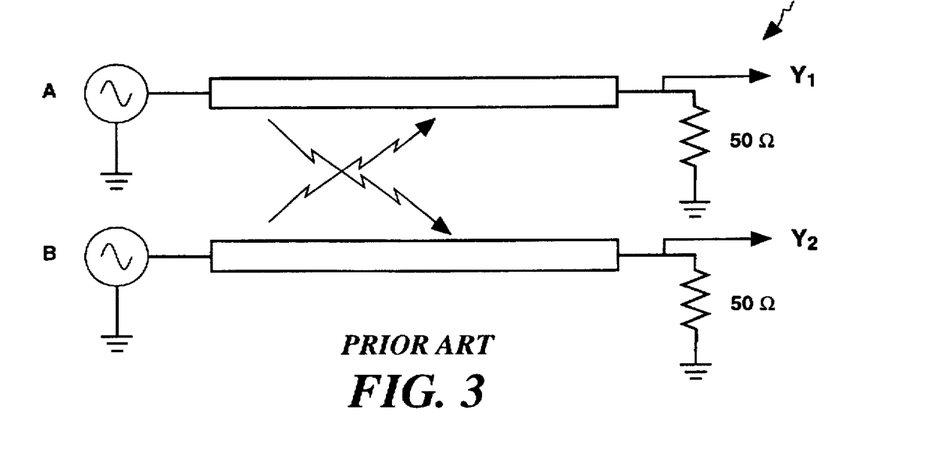
FIG. 3 is a high-level pictorial representation of the prior art coupler in FIG. 2.

There are several ways to construct coupler 30. One way is to use shielded (double ground plane) striplines or microstriplines. This stripline coupling technique is schematically represented in FIG. 3 and described in U.S. Pat. No. 3,731,217 to Gerst et al. (1973), which is incorporated herein by reference.

Figure 4:
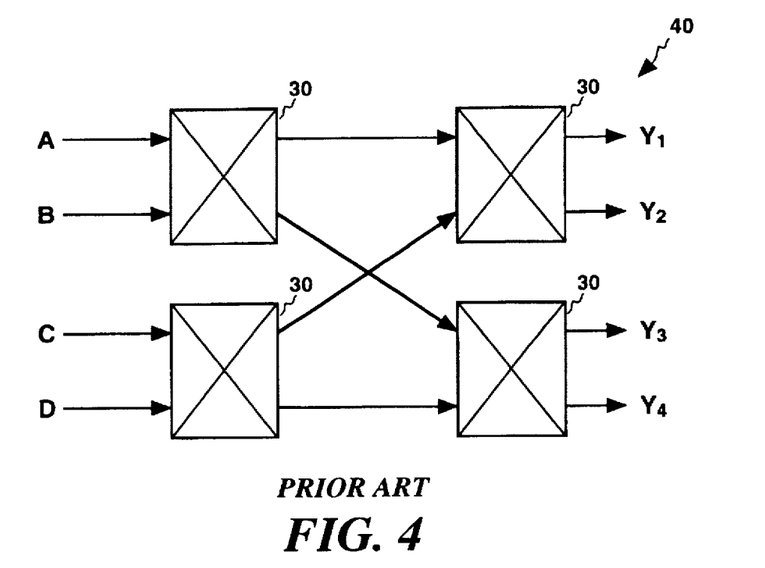
FIG. 4 is a high-level schematic representation of a prior art Fourier Transform Matrix.

With reference now to FIG. 4, a 4×4 Fourier Transform Matrix is illustrated. As illustrated, Fourier Transform Matrix 40 includes four couplers 30 connected as shown. Such a 4×4 transform matrix has four inputs and four outputs.

Figure 5:
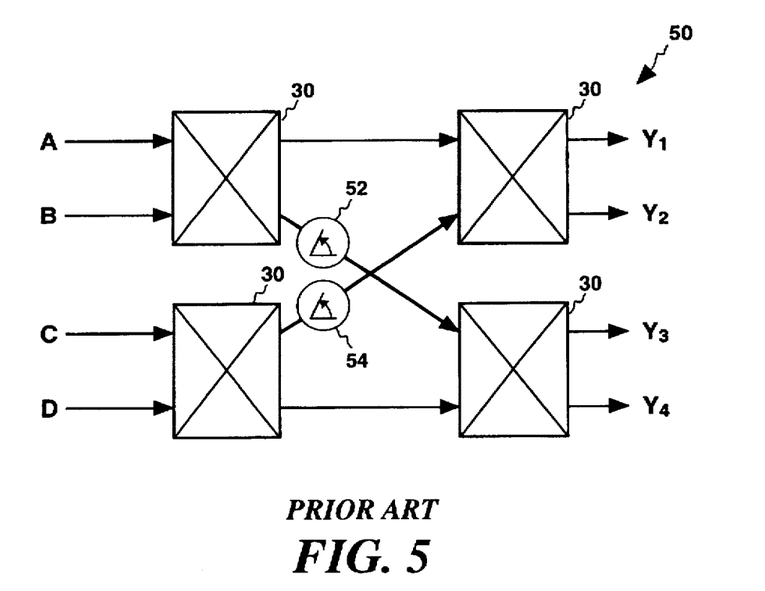
FIG. 5 is a high-level block diagram of a prior art Butler Transform Matrix.

FIG. 5 shows a 4×4 transform matrix known as a Butler type transform matrix. Butler matrix 50 is essentially the Fourier Transform Matrix 40 with the addition of phase shifters 52 and 54. If phase shifters 52 and 54 are 45° phase shifters, Butler matrix 50 is referred to as a 45° Butler matrix.

Referring again to FIG. 1, an amplifier in amplifier array 26 has a cost proportional to a design parameter referred to as a peak to average ratio. This peak to average ratio compares the peak power output capability of the amplifier to the average power the amplifier is designed to sustain. A higher peak power, which raises the peak to average ratio, requires larger or more expensive components in the amplifier. Thus, an amplifier designed for a higher peak to average ratio is more expensive and more difficult to design.

In an effort to reduce amplifier cost, amplifier designers may include a clipping circuit before the amplifier to limit the instantaneous output signal amplitude to a predetermined maximum value, regardless of the amplitude of the signal input into the clipper circuit. Thus, the clipper circuit guarantees that the input to the amplifier will never exceed a fixed amplitude, thereby preventing an overload condition. When the input signal to the amplifier is limited to this fixed amplitude, the output of the amplifier is also limited, assuming the amplifier has a fixed gain. If the amplifier output amplitude is limited to a predetermined maximum, the amplifier may be easier to design and cheaper to construct.

If hybrid matrix amplifier 20 is used in a system, such as a communications system, wherein signals on input ports $I_n$ have a peak amplitude at different times, the problem of detecting and preventing an overload condition in amplifier array 26 becomes a complicated one. Individually limiting the power at input ports $I_n$ using traditional methods may not prevent an overload condition in the amplifiers in the amplifier array 26. Traditional clipping may fail because the signals at input ports $I_n$ are divided in amplitude and shifted in phase by hybrid matrix 22 so that the signals to the amplifiers in amplifier array 26 include new combinations of signals having new peak amplitudes that result in an overload condition. This new combination of signals is not easily calculated by examining the input signals to hybrid matrix 22.

A solution to the problem of not being able to detect an appropriate clipping level for each input would be to clip or limit the input signal at a lower level so that an overload condition is less likely to occur in amplifier array 26. However, this additional clipping decreases the quality of the signal being amplified.

The quality can be quantified by a quality factor $\rho$. The $\rho$ quality factor is defined by:

$$\rho = \frac{E^2(xy^*)}{E(x^2)E(yy^*)}$$

where x is the original real signal, y=I+jQ (the complex I and Q clipped signal), and y* is the complex conjugate of y. According to a standard promulgated by the Telecommunications Industries Association/Electronic Industries Association/Interim Standard-95 (TIA/EIA/IS-95) entitled *Mobile Station-Base Station Compatibility Standard for Dual Mode Wide Band Spread Spectrum Cellular System*, July 1993, the signal quality factor ρ must exceed 94.9% (measured at the receiver).

Therefore, a need exists for a method and system for preventing an amplifier overload condition in a hybrid matrix amplifier array without overly reducing the quality factor of the amplified signal.

BRIEF DESCRIPTION OF THE DRAWINGS

The novel features believed characteristic of the invention are set forth in the appended claims. The invention itself, however, as well as a preferred mode of use, further objects, and advantages thereof, will best be understood by reference to the following detailed description of an illustrative embodiment when read in conjunction with the accompanying drawings, wherein:

DETAILED DESCRIPTION OF THE INVENTION

Figure 6:
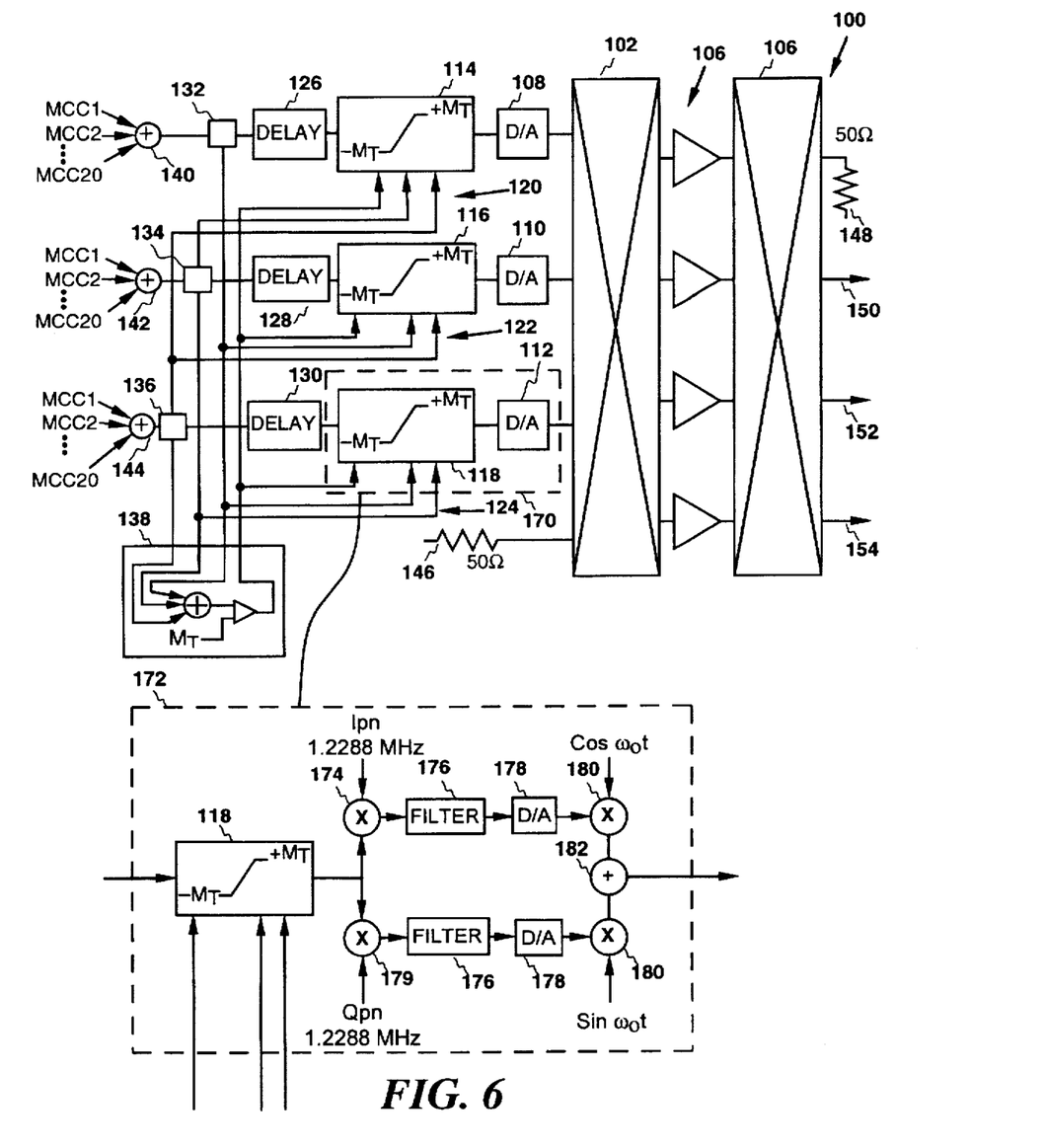
FIG. 6 is a block diagram of a hybrid matrix amplifier incorporating the method and system for preventing an amplifier overload condition in accordance with the method and system of the present invention.

With reference now to the figures, and in particular with reference to FIG. 6, there is depicted a schematic representation of a hybrid matrix amplifier in accordance with the method and system of the present invention. As illustrated, hybrid matrix amplifier 100 includes transform matrix 102, which has output ports coupled to amplifier array 104. The outputs of amplifier array 104 are coupled to input ports of inverse transform matrix 106. In the embodiment shown in FIG. 6, transform matrix 102 and inverse transform matrix 102 are 4×4 transform matrices having four inputs and four outputs. It should be understood that transform matrix 102 and inverse transform matrix 106 need not be square matrices, and any size matrix larger than a 2×2 matrix may be selected. Thus, matrices 102 and 106 may be n×m transform matrices.

Transform matrix 102 and inverse transform matrix 106 may be implemented with different types of matrices. For example, a Fourier transform matrix or a Butler transform matrix may be used. Additionally, other transform matrices that distribute signal power from one input to multiple outputs in various phase relationships may be used.

Amplifiers in amplifier array 104 receive a low level input signal and output a high level signal that substantially matches the input signal. Amplifier array 104 may be implemented with amplifiers sold under part number "MHW927B" by Motorola, Inc., of Schaumburg, Ill., 60196. For best performance, the amplifiers in amplifier array 104 should be matched in gain and phase delay.

Because a Fourier or Butler transform matrix may be used as its own inverse matrix, inverse transform matrix 106 is typically the same type and size as transform matrix 102. In hybrid matrix amplifier 100, the purpose of inverse transform matrix 106 is to separate the amplified signals into discrete output signals. Thus, a signal input into transform matrix 102 may be refocused to a particular output of inverse transform matrix 106.

Transform matrix 102 and inverse transform matrix 106 may be implemented by transform matrices similar to ones sold under part number "580014" by Anaren Microwave, Inc., in East Syracuse, N.Y., 13057.

Signals input into transform matrix 102 come from the analog outputs of D/A (digital to analog) converters 108–112. In a CDMA communications system implemented according to the Wideband Spread Spectrum Cellular System standard EIA/TIA/IS-95, these D/A converters are implemented with a D/A converter that converts 12-bit numbers to an analog output at the rate of 4.9152 conversions per second.

Signals input into D/A converters 108–112 come from attenuators, such as clipping circuits 114–118. Such attenuators are used to reduce the amplitude of a signal. According to an important aspect of the present invention, clipping circuits 114–118 limit the peak amplitude of input signals in response to the amplitude of the input signal in conjunction with the amplitude, or other signal characteristics, of signals input on alternate inputs of transform matrix 102. As shown at reference numerals 120–124, each clipping circuit 114–118 receives an input representing at least the amplitude of other input signals that will be input into transform matrix 102.

Delay blocks 126–130 are needed to correctly synchronize all input signals as each clipping circuit 114–118 decides whether or not to clip its own input signal.

Preceding delay blocks 126–130 are estimators 132–136. The purpose of estimators 132–136 is to measure the amplitude of the corresponding input signal. In a digital system, amplitudes may be determined by examining the bits of the digital sample, excluding the sign bit. Amplitude measurements from estimators 132–136 are coupled to overload condition detector 138.

Overload condition detector 138 estimates that an overload condition will occur in amplifier array 106 if input signals are not clipped or otherwise attenuated by clipping circuits 114–118. In one embodiment of the present invention, an overload condition is estimated by summing the amplitude of the input signals and comparing the sum to a threshold, $M_T$. By comparing a sum to a threshold, the detection of an overload condition is more of an estimate. In other embodiments, the amplitude splitting and phase shifting that occurs in transform matrix can be considered to get a more accurate estimate of whether or not a signal input into an amplifier in amplifier array 106 will cause an amplifier overload condition.

With regard to the input signals, they are formed at summers 140–144 by summing several input signals in the form of serial streams of digital data. In a CDMA communications system, these data streams may include pilot, page, and sync channels, along with any traffic channels. These data streams are shown as MCC1–MCC20 in FIG. 6.

In a hybrid matrix amplifier having complex input signals, the circuitry in box 170 may be implemented with the circuitry shown in block 172. Clipping circuit 118 in block 172 is the same as in block 170. The output of clipping circuit 118 is coupled to frequency spreaders 174, which up-converts base band digital signals at 19.2 kilo-samples per second to 1.2288 mega-samples per second. After the up-converting process, 4X interpolator filter 176 increases the sampling rate by four times without increasing the spectrum bandwidth. Following up-converting filters 176, digital to analog converters 178 convert IQ signals from the digital domain to the analog domain. Once the IQ signals are in the analog domain, the signals are fed into a quadrature RF up-converter, as shown at reference numerals 180 and 182. Therefore, the output of block 172 is a radio frequency signal that conforms to the TIA/EIA/IS-95 specification at the center frequency of $\omega_0$.

In hybrid matrix amplifier 100, inverse transform matrix 106 is the same as transform matrix 102. Because the same matrix is used as its inverse, input signals from D/A 108 are refocused at output 154 on inverse transform matrix 106. Similarly, output signals from D/A 110 are refocused at output 152, and output signals from D/A 112 are focused at output 150. Also shown in the example of FIG. 6, is an unused input port on transform matrix 102 that is terminated by resistor 146. Because one input of transform matrix 102 is terminated by resistor 146, a corresponding output of inverse transform matrix 106 must also be terminated by resistor, such as resistor 148. Because there is no input power at the input of transform matrix 102 that is connected to resistor 146, there should be no output power refocused at the output connected to resistor 148.

Figure 7:
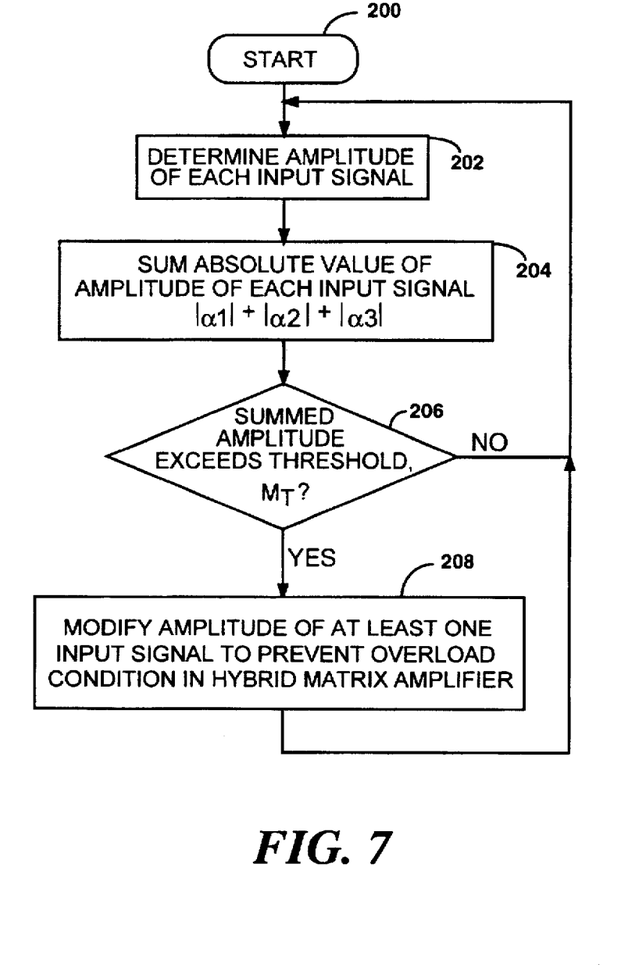
FIG. 7 is a high-level logic flowchart which illustrates the overall method of operation of the present invention.

With reference now to FIG. 7, there is depicted a high-level flowchart that illustrates the method and operation of the present invention. As illustrated, the process begins at block 200 and thereafter passes to block 202 wherein the amplitude of each input signal is determined.

Next, the process sums the absolute value of the amplitude of each input signal, as illustrated at block 204. The amplitude of the input signals may be represented by the variable $\alpha_i$.

Next, the process compares the summed amplitude to a threshold, $M_T$ as depicted at block 206. If the summed amplitude exceeds threshold $M_T$, the process modifies the amplitude of at least one of the input signals to prevent an overload condition in the hybrid matrix amplifier, as illustrated at block 208.

Figure 8:
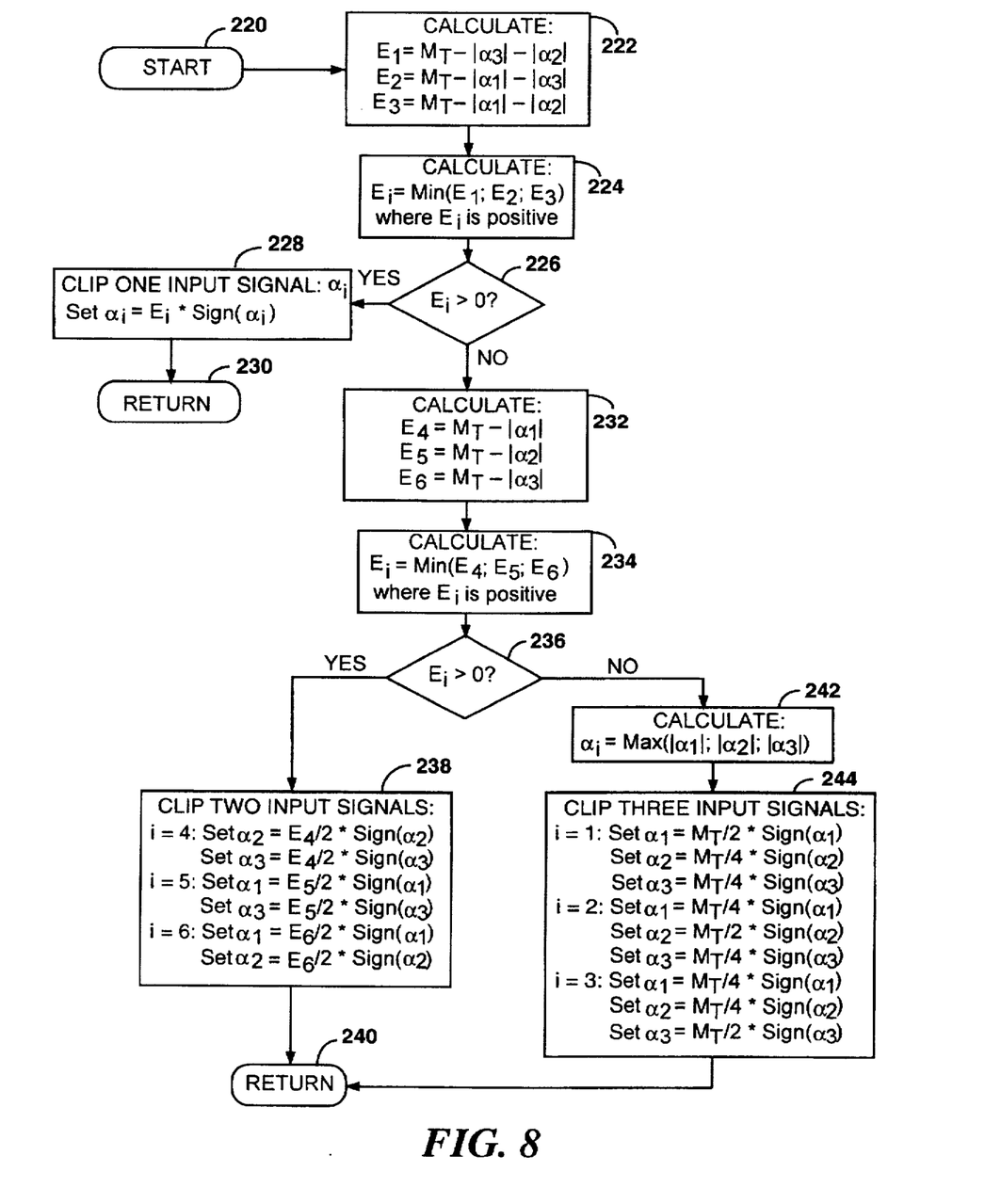
FIG. 8 is a high-level logic flowchart which illustrates one embodiment of a portion of the flowchart of FIG. 7 in accordance with the present invention.
Figure 9:
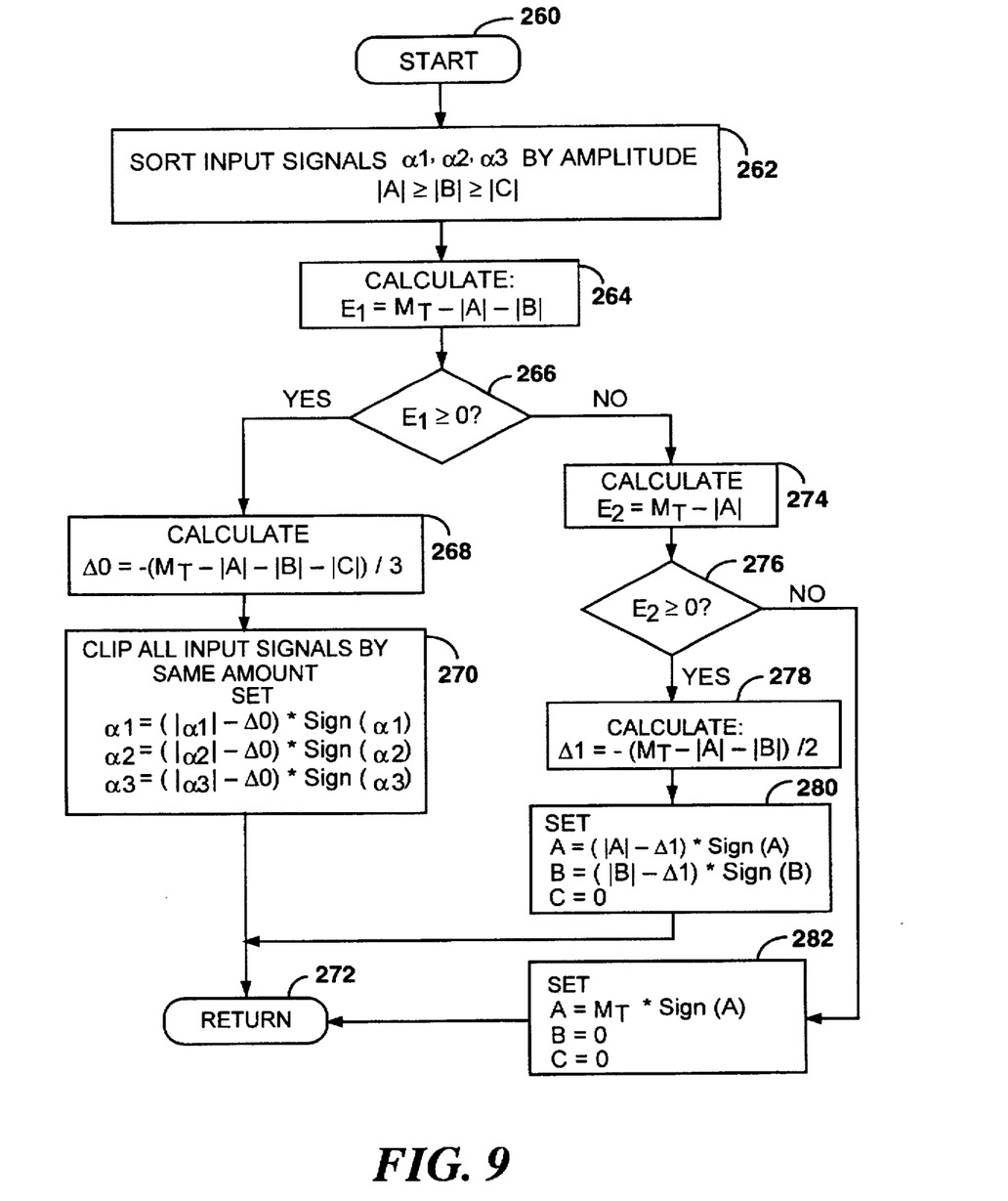
FIG. 9 is a high-level logic flowchart which illustrates another embodiment of a portion of the flowchart of FIG. 7 in accordance with the present invention.
Figure 10:
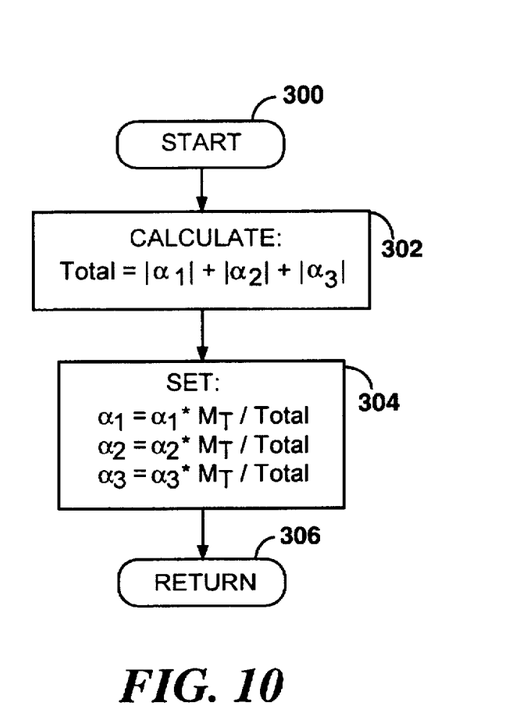
FIG. 10 is a high-level logic flowchart which illustrates a preferred embodiment of a portion of the flowchart of FIG. 7 in accordance with the present invention.

FIGS. 8, 9, and 10, along with their descriptions below, describe different embodiments of the operation depicted in block 208 of FIG. 7.

With reference now to FIG. 8, there is depicted the process of modifying at least one input signal amplitude to prevent amplifier overload condition in a hybrid matrix amplifier according to an embodiment of the present invention. As illustrated, the process starts at block 220 and thereafter proceeds to block 222. As illustrated at block 222 and 224, the process attempts to locate the smallest input signal that may, by itself, be attenuated or clipped to reduce the summed amplitude to a level equal to or below threshold $M_T$. As depicted at block 226, the process determines whether or not any single input signal may be clipped to eliminate an overload condition. If a single input signal $\alpha_i$ may be clipped, the process clips one input signal by an amount necessary to reduce the summed amplitude to a value equal or less than threshold $M_T$, as illustrated at block 228. Thereafter, the process returns to block 202 in FIG. 7, as depicted at block 230.

If it is not possible to clip only one input signal to reduce the summed amplitude to at least threshold $M_T$, the process determines whether or not two input signals may be reduced in magnitude to reduce the sum amplitude to a value equal to or less than threshold $M_T$. As illustrated in block 232 and 234, the process selects the two smallest input signals that may be used to reduce the sum amplitude. As depicted at block 236, the process determines whether or not two input signals may be reduced in amplitude to reduce the summed amplitude to a value equal to or less than threshold $M_T$. If only two channels may be reduced in amplitude to prevent the overload condition, the two input signals having the smallest combined amplitude are selected and reduced in magnitude by an equal amount, as illustrated at block 238. Following the clipping of the two selected input signals that allow the amplitude to be reduced below the threshold, the process returns to block 202 in FIG. 7, as depicted at block 240.

If, at block 236, the process determines that no two input signals may be reduced in amplitude by a combined value large enough to reduce the summed amplitude to a value equal to a below threshold $M_T$, the process selects the largest of the three input signals, as illustrated at block 242. Thereafter, the process sets the largest of the three input signals equal to a value that is half of threshold $M_T$, and sets the other two input signals to a value equal to one-quarter of a threshold $M_T$, as depicted at block 244. Thus, the largest signal is clipped the most if it is necessary to clip all three input signals. In this embodiment, the largest signal remains the largest signal after the clipping operation.

Following the clipping of all three input signals at block 244, the process returns to block 202 in FIG. 7, as illustrated at block 240.

To summarize the operation of the embodiment shown in FIG. 8, the process locates the minimum number of input signals that can be clipped or attenuated by a value to reduce the summed amplitude to a value equal to or below threshold $M_T$. If no single input channel can be clipped by an amount large enough to reduce the summed amplitude to a value equal to or below threshold $M_T$, the process tries to find two channels with the smallest combined of two channels that may be reduced to a calculated amplitude to prevent an overload condition. If no two input signals can be reduced to prevent the overload condition, the process replaces the amplitude of all three input signals with calculated amplitudes, where the largest input signal is set to a larger value.

With reference now to FIG. 9, there is depicted a second embodiment of the method and system for modifying signal amplitudes to prevent an overload condition in a hybrid matrix amplifier according to the present invention. As depicted, the process begins at block 260, and thereafter passes to block 262 wherein the process sorts the input signals by amplitude. In this example, letters A, B, and C represent the amplitude of the input signals, wherein A represents the input signal with the highest amplitude and C represents the power of the signal with the lowest amplitude. At blocks 264 and 266, the process determines whether or not all three input signals may be reduced equally by an amount necessary to reduce the summed amplitude to a value equal to or less than threshold $M_T$.

If all three input signals may be reduced by the same amount to prevent an overload condition, the process calculates the amount that will be subtracted from each input signal amplitude, as illustrated at block 268. Thereafter, all input signals are reduced by the same amount, as depicted at block 270. After eliminating the overload condition, the process returns to block 202 of FIG. 7, as illustrated at block 272.

With reference again to block 266, if the amplitude of one signal is small and three input signals cannot be reduced by the same amount, the process determines whether or not the overload condition can be eliminated by reducing the two most powerful signals by the same amount while setting the least powerful signal to zero, as illustrated at blocks 274 and 276.

If the two most powerful signals may be reduced by the same amount in and a third least powerful signal reduced to zero, the process determines the magnitude of the input signal reduction, $\Delta 1$, as depicted at block 278. After calculating $\Delta 1$, the process reduces the two most powerful signals by the value of $\Delta 1$, and sets the value of the least powerful input signal to zero, as illustrated at block 280. After clipping the two most powerful input signals and setting the least powerful signal to zero, the process returns to block 202 in FIG. 7, as depicted at block 272.

Referring to block 276, if the process determines that the two signals with the greatest amplitude cannot be reduced in magnitude equally to eliminate the overload condition, the process sets the highest amplitude signal equal to threshold $M_T$ and sets the other two input signals equal to zero, as depicted at block 282. Thereafter, the process returns to block 202 in FIG. 7, as illustrated at block 272.

Therefore, the process illustrated in FIG. 9, or attenuates clips all three input signals evenly, even if only one signal could be clipped to eliminate and overload condition. If all three signals cannot be clipped evenly, two signals are clipped by the same amount and the signal with the least amplitude is set to zero. And finally, if two signals cannot be clipped by an equal amount, one signal is clipped and the two signals with the least amplitude are set to zero.

With reference now to FIG. 10, there is depicted a third and preferred embodiment of a process for modifying the amplitude of input signals to eliminate an overload condition in a hybrid matrix amplifier according to the present invention. As illustrated, the process begins at block 300 and thereafter passes to block 302. As illustrated in block 302, the process calculates a total amplitude by summing the absolute value of all input signals. Next, the process reduces the amplitude of all three input signals by an equal proportion, as depicted at block 304. The amount of this proportionate reduction is calculated by dividing threshold $M_T$ by the total amplitude.

After reducing the amplitude of all three input signals proportionately, the process returns to block 202 in FIG. 7, as illustrated at block 306.

In the embodiment shown in FIG. 10, the rate of clipping or input signal modification occurs more frequently and signals are reduced by smaller amplitude, compared to the embodiments shown in FIG. 8 and 9.

Because hybrid matrix amplifier 100 is not a linear system, tests or simulations are necessary to determine which embodiment reduces the peak to average ratio for the same quality factor $\rho$. When $\rho$ is set to 99.5%, the embodiment shown in FIG. 8 (clip only one signal if possible) yields a 9.57 dB peak to average ratio for three input signals, and 9.9 dB for six input signals. The embodiment shown in FIG. 9 (clip all signals by same amount if possible) yields a 9.3 dB peak to average ratio for three input signals, and 9.69 dB for six input signals ($\rho$=99.5%). And, the preferred embodiment shown in FIG. 10 (clip all inputs proportionately) produces a 9.1 dB peak to average ratio for three input signals and a 9.28 dB ratio for six input signals ($\rho$=99.5%). Under the same test circumstances, but without clipping, the peak to average ratio was 11.17 dB for a three input hybrid matrix amplifier and 10.58 dB for a six input hybrid matrix amplifier.

Although the embodiments for preventing amplifier overload condition shown in FIGS. 8 and 9, are illustrated with an example using three input signals, embodiments using additional input signals may be implemented. For example, if six input signals are used, the six input signals may be divided into two three input signal blocks, each with its own threshold level, such as $M_a$ and $M_b$ such that $M_T=M_a+M_b$. Two three-input signal blocks are used because six input signals greatly increases the complexity of clipping circuits 114–118 in FIG. 6. Complexity increases because each clipping circuit 114–118 would receive signal amplitude information from five other input signals which would then be used to determine the appropriate clipping level at each channel.

The foregoing description of a preferred embodiment of the invention has been presented for the purpose of illustration and description. It is not intended to be exhaustive or to limit the invention to the precise form disclosed. Modifications or variations are possible in light of the above teachings. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for preventing an amplifier overload condition in a hybrid matrix amplifier array comprising the steps of:

measuring signal amplitude of each of a plurality of input signals;

in response to said signal amplitude measurements, estimating an overload condition that will result in an amplifier overload in said hybrid matrix amplifier array; and in response to estimating said overload condition, modifying said signal amplitude of at least one of said plurality of input signals to prevent said overload condition in said hybrid matrix amplifier array.

2. The method for preventing an amplifier overload condition in a hybrid matrix amplifier array according to claim 1 wherein said step of estimating an overload condition that will result in an amplifier overload in said hybrid matrix amplifier array includes detecting that the sum of an absolute value of each of said measured signal amplitudes exceeds an overload threshold.

3. The method for preventing an amplifier overload condition in a hybrid matrix amplifier array according to claim 1 wherein said step of modifying said signal amplitude of at least one of said plurality of input signals to prevent said overload condition includes reducing the amplitude of a minimum number of input signals that can be reduced in amplitude to prevent said overload condition.

4. The method for preventing an amplifier overload condition in a hybrid matrix amplifier array according to claim 1 wherein said step of modifying said signal amplitude of at least one of said plurality of input signals to prevent said overload condition includes reducing the amplitude of a lowest amplitude input signal that can be reduced in amplitude to prevent said overload condition.

5. The method for preventing an amplifier overload condition in a hybrid matrix amplifier array according to claim 3 wherein said step of modifying said signal amplitude of at least one of said plurality of input signals to prevent said overload condition includes reducing the amplitude of a group of input signals, wherein said group of input signals includes the minimum number of input signals with the minimum summed amplitude that can be reduced to eliminate said amplifier overload condition.

6. The method for preventing an amplifier overload condition in a hybrid matrix amplifier array according to claim 1 wherein said step of modifying said signal amplitude of at least one of said plurality of input signals to prevent said overload condition includes reducing the amplitude of all of said input signals to prevent said overload condition.

7. The method for preventing an amplifier overload condition in a hybrid matrix amplifier array according to claim 1 wherein said step of modifying said signal amplitude of at least one of said plurality of input signals to prevent said overload condition includes proportionately reducing the amplitude of all of said input signals to prevent said overload condition.

8. A system for preventing an amplifier overload condition in a hybrid matrix amplifier array comprising:

means for measuring signal amplitude of each of a plurality of input signals;

means for estimating an overload condition that will result in an amplifier overload in said hybrid matrix amplifier array in response to said signal amplitude measurements; and means for modifying said signal amplitude of at least one of said plurality of input signals to prevent said overload condition in said hybrid matrix amplifier array in response to estimating said overload condition.

9. The system for preventing an amplifier overload condition in a hybrid matrix amplifier array according to claim 8 wherein said means for estimating an overload condition that will result in an amplifier overload in said hybrid matrix amplifier array includes means for detecting that the sum of an absolute value of each of said measured signal amplitudes exceeds an overload threshold.

10. The system for preventing an amplifier overload condition in a hybrid matrix amplifier array according to claim 8 wherein said means for modifying said signal amplitude of at least one of said plurality of input signals to prevent said overload condition includes means for reducing the amplitude of a minimum number of input signals that can be reduced in amplitude to prevent said overload condition.

11. The system for preventing an amplifier overload condition in a hybrid matrix amplifier array according to claim 8 wherein said means for modifying said signal amplitude of at least one of said plurality of input signals to prevent said overload condition includes means for reducing the amplitude of a lowest amplitude input signal that can be reduced in amplitude to prevent said overload condition.

12. The system for preventing an amplifier overload condition in a hybrid matrix amplifier array according to claim 10 wherein said means for modifying said signal amplitude of at least one of said plurality of input signals to prevent said overload condition includes means for reducing the amplitude of a group of input signals, wherein said group of input signals includes the minimum number of input signals with the minimum summed amplitude that can be reduced to eliminate said amplifier overload condition.

13. The system for preventing an amplifier overload condition in a hybrid matrix amplifier array according to claim 8 wherein said means for modifying said signal amplitude of at least one of said plurality of input signals to prevent said overload condition includes means for reducing the amplitude of all of said input signals to prevent said overload condition.

14. The system for preventing an amplifier overload condition in a hybrid matrix amplifier array according to claim 8 wherein said means for modifying said signal amplitude of at least one of said plurality of input signals to prevent said overload condition includes means for proportionately reducing the amplitude of all of said input signals to prevent said overload condition.

15. A system for preventing an amplifier overload condition in a hybrid matrix amplifier array comprising:

a plurality of input signal amplitude estimators, each serially coupled to a plurality of input signals;

a hybrid matrix amplifier array overload condition detector coupled to each of said plurality of input signal power estimators for producing an overload condition signal in response to detecting an amplifier overload condition; and at least one attenuator serially coupled to one of said input signals for reducing the power of said input signal in response to said overload condition signal, wherein said amplifier overload condition is eliminated.

16. The system for preventing an amplifier overload condition in a hybrid matrix amplifier array according to claim 15 wherein said hybrid matrix amplifier array overload condition detector includes:

a summer for producing a total amplitude signal equal to the sum the absolute values of all input signal amplitudes received from said input signal amplitude estimators; and a comparator for indicating an amplifier overload condition in response to said total amplitude signal exceeding a threshold.

17. The system for preventing an amplifier overload condition in a hybrid matrix amplifier array according to claim 15 wherein said at least one attenuator is a clipping circuit that includes means for reducing the amplitude of said serially coupled input signal in response to said overload condition signal and amplitudes of others of said plurality of input signals.

18. The system for preventing an amplifier overload condition in a hybrid matrix amplifier array according to claim 15 wherein each of said plurality of input signals is a series of digital samples.

19. The system for preventing an amplifier overload condition in a hybrid matrix amplifier array according to claim 15 wherein each of said plurality of input signals is serially coupled to one of said attenuators, and each of said attenuators includes amplitude attenuation means for reducing the amplitude of each of said plurality of input signals by a proportionate amount to eliminate said amplifier overload condition.

* * * * *